(12) United States Patent  (10) Patent No.: US 7,671,738 B2
Wu et al.  (45) Date of Patent: Mar. 2, 2010

(54) FAN SYSTEM AND DRIVING CONTROL DEVICE OF MOTOR

(75) Inventors: Chia-Huang Wu, Taoyuan Hsien (TW); Yen-Hung Wu, Taoyuan Hsien (TW); Yi-Chieh Cho, Taoyuan Hsien (TW); Yueh-Lung Huang, Taoyuan Hsien (TW); Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 361 days.

(21) Appl. No.: 11/898,734

(22) Filed: Sep. 14, 2007

(65) Prior Publication Data

US 2008/0088463 A1   Apr. 17, 2008

(30) Foreign Application Priority Data

Oct. 16, 2006   (TW)   ............................... 95138042 A

(51) Int. Cl.
 *G08B 1/08*   (2006.01)
(52) U.S. Cl. .................. 340/539.27; 340/584; 340/588; 340/643; 700/300
(58) Field of Classification Search ................. 340/441, 340/501, 507, 539.26, 539.27, 539.22, 584, 340/588, 589, 643, 655, 693.6; 236/1 C, 236/49.3; 381/71.1; 361/687, 688, 719; 700/300, 304
See application file for complete search history.

(56) References Cited

U.S. PATENT DOCUMENTS

| 6,654,894 B2* | 11/2003 | Kaminski et al. ............ 713/300 |
| 2006/0142901 A1* | 6/2006 | Frankel et al. .............. 700/300 |
| 2006/0196954 A1* | 9/2006 | Okuda et al. ............... 236/49.3 |

* cited by examiner

*Primary Examiner*—Toan N Pham
(74) *Attorney, Agent, or Firm*—Birch, Stewart, Kolasch & Birch, LLP

(57) ABSTRACT

A driving control device of a motor includes a temperature sensing circuit, a comparing circuit, a rotation speed control circuit and a driving circuit. The temperature sensing circuit detects an environmental temperature for generating a sensing signal. The comparing circuit is electrically connected to the temperature sensing circuit, and compares the sensing signal with a reference voltage signal for outputting a comparing signal. The rotation speed control circuit is electrically connected to the comparing circuit and has a first threshold voltage and a second threshold voltage, both of which are compared with the comparing signal for outputting a rotation speed control signal. The driving circuit is electrically connected to the rotation speed control circuit, and generates a driving signal to drive the motor in accordance with the rotation speed control signal.

21 Claims, 4 Drawing Sheets

FAN SYSTEM AND DRIVING CONTROL DEVICE OF MOTOR

CROSS REFERENCE TO RELATED APPLICATIONS

This non-provisional application claims priority under 35 U.S.C. §119(a) on Patent Application No. 095138042 filed in Taiwan, Republic of China on Oct. 16, 2006, the entire contents of which are hereby incorporated by reference.

BACKGROUND OF THE INVENTION

1. Field of Invention

The invention relates to a driving control device, and more particularly to a fan system and a driving control device of a motor.

2. Related Art

The heat dissipating problem of an electronic device is more and more important nowadays due to the increase of the data processing information and the processing speed of the electronic device. In addition, the integrated process had become advanced so that more electronic elements can be contained in the same electronic device. The major heat dissipating method is to provide a fan in or on the electronic device for inducing the air convection so as to achieve the heat dissipating effect.

Accordingly, the thermal controlled fan, which can sense the environment temperature by a sensing element and adjusts the rotation speed thereof in accordance with the temperature, is disclosed. The sensing element can be a thermal resistor, which is sensitive to the temperature variation and can change its resistance value according to different temperatures. In addition, the thermal resistors include a positive temperature coefficient (PTC) resistor and a negative temperature coefficient (NTC) resistor. The resistance of the PTC resistor increases and that of the NTC resistor decreases when the temperature increases. Now, the thermal resistor is widely applied as the sensing element in the electronic device for facilitating the control and compensation of other circuits in the electronic device.

FIG. 1A is a schematic block diagram of a conventional fan system 1, and FIG. 1B is a schematic circuit diagram of the fan system 1 in FIG. 1A. Referring to FIGS. 1A and 1B, the fan system 1 includes a temperature sensing circuit 11, a driving circuit 12 and a fan 13. The temperature sensing circuit 11 senses an environment temperature for generating a sensing signal S11. The driving circuit 12 receives the sensing signal S11 and transfers it into a driving signal S12 so as to drive the fan 13.

The temperature sensing circuit 11 has a resistor R and a thermal resistor RT, which are connected in series so as to divide the operating voltage $V_{CC}$. The thermal resistor RT generates a resistance in accordance with the environment temperature. The variation of the resistance causes a node voltage value V1 with variation between the thermal resistor RT and the resistor R so as to output the temperature sensing signal S11. The driving circuit 12, which is a chip or a microprocessor, receives the temperature sensing signal S11 and transfers it into the driving signal S12 so as to drive the motor 131 of the fan 13.

As mentioned above, the driving circuit 12 of the conventional fan system 1 must receive and transfer the temperature sensing signal S11 into the driving signal S12 with a high voltage level or a high current level so as to drive the fan 13.

In order to adjust the driving signal S12 in accordance with the temperature variation immediately, the chip of the present driving circuit 12 is usually integrated in a chip with multiple functions and the chip is expensive. In this way, the expensive chip also raises the cost of the whole electronic system. The expensive chip thus limits its application fields. Therefore, it is an important subject to provide a driving control device having low cost and suitable for more application fields.

SUMMARY OF THE INVENTION

In view of the foregoing, the present invention is to provide a fan system and a driving control device of a motor, which having low cost and are suitable for more application fields. The fan system and driving control device of the present invention also have two stages of rotation speeds in accordance with the environment variation.

To achieve above, the invention discloses a driving control device of a motor. The driving control device includes a temperature sensing circuit, a comparing circuit, a rotation speed control circuit and a driving circuit. The temperature sensing circuit senses an environment temperature to generate a sensing signal. The comparing circuit is electrically connected to the temperature sensing circuit and compares the sensing signal with a reference voltage signal to output a comparing signal. The rotation speed control circuit is electrically connected to the comparing circuit and has a first threshold value and a second threshold value. The rotation speed control circuit generates a rotation speed control signal after comparing the comparing signal with the first and the second threshold values. The driving circuit generates a driving signal to drive the motor in accordance with the rotation speed control signal.

To achieve above, the invention also discloses a fan system having a driving control device and a fan. The driving control device includes a temperature sensing circuit, a comparing circuit, a rotation speed control circuit and a driving circuit. The temperature sensing circuit senses an environment temperature to generate a sensing signal. The comparing circuit is electrically connected to the temperature sensing circuit and compares the sensing signal with a reference voltage signal to output a comparing signal. The rotation speed control circuit is electrically connected to the comparing circuit and has a first threshold value and a second threshold value. The rotation speed control circuit generates a rotation speed control signal after comparing the comparing signal with the first and the second threshold values. The driving circuit generates a driving signal to drive the motor in accordance with the rotation speed control signal. The fan has a motor electrically connected to the driving control device. The motor receives the driving signal so that the rotation speed of the motor can be controlled according to the driving signal.

As mentioned above, the fan system and driving control device of the invention utilizes the comparing circuit to transfer the sensing signal generated by the temperature sensing circuit into the comparing signal, which is then inputted into the rotation speed control circuit so as to generate the rotation speed control signal. When the comparing signal achieves the first threshold value, the rotation speed control circuit outputs a rotation speed control signal indicating a first rotation speed. When the comparing signal achieves the second threshold value, then the rotation speed control circuit outputs another rotation speed control signal indicating a second rotation speed. Therefore, the rotation speed control of the temperature controlled fan can be carried out by the simple design of the comparing circuit and the rotation speed control circuit.

Accordingly, the manufacturing cost can be decreased and the rotation speed control circuit can then be applied in more application fields with the fan system or the driving control device of the motor.

BRIEF DESCRIPTION OF THE DRAWINGS

The invention will become more fully understood from the detailed description and accompanying drawings, which are given herein below for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1A:
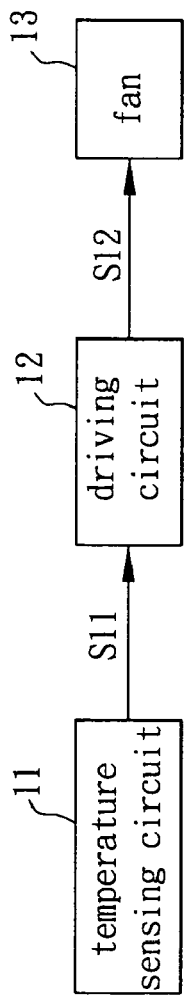
FIG. 1A is a schematic block diagram of a conventional fan system.
Figure 1B:
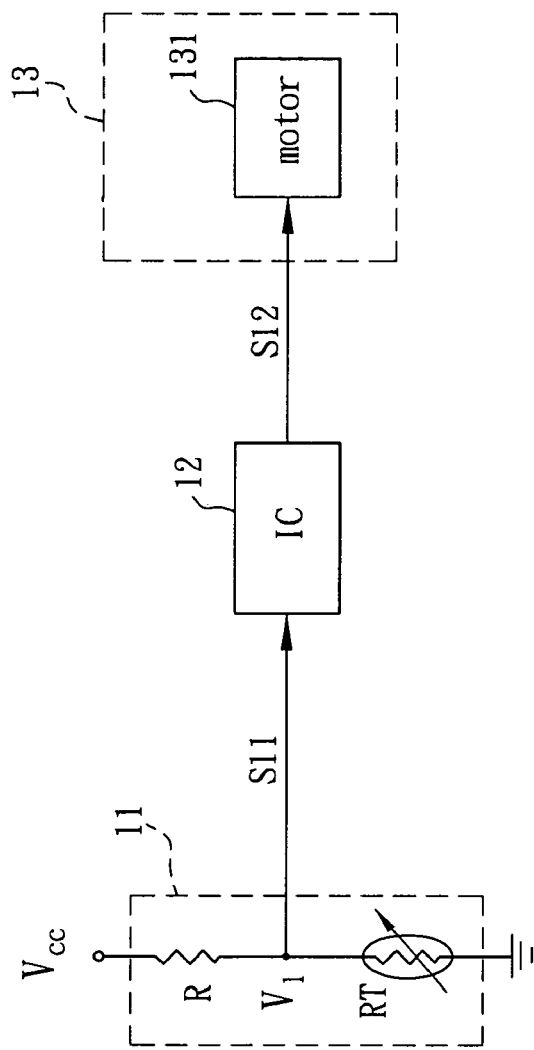
FIG. 1B is a schematic circuit diagram of the conventional fan system in FIG. 1A.
Figure 2:
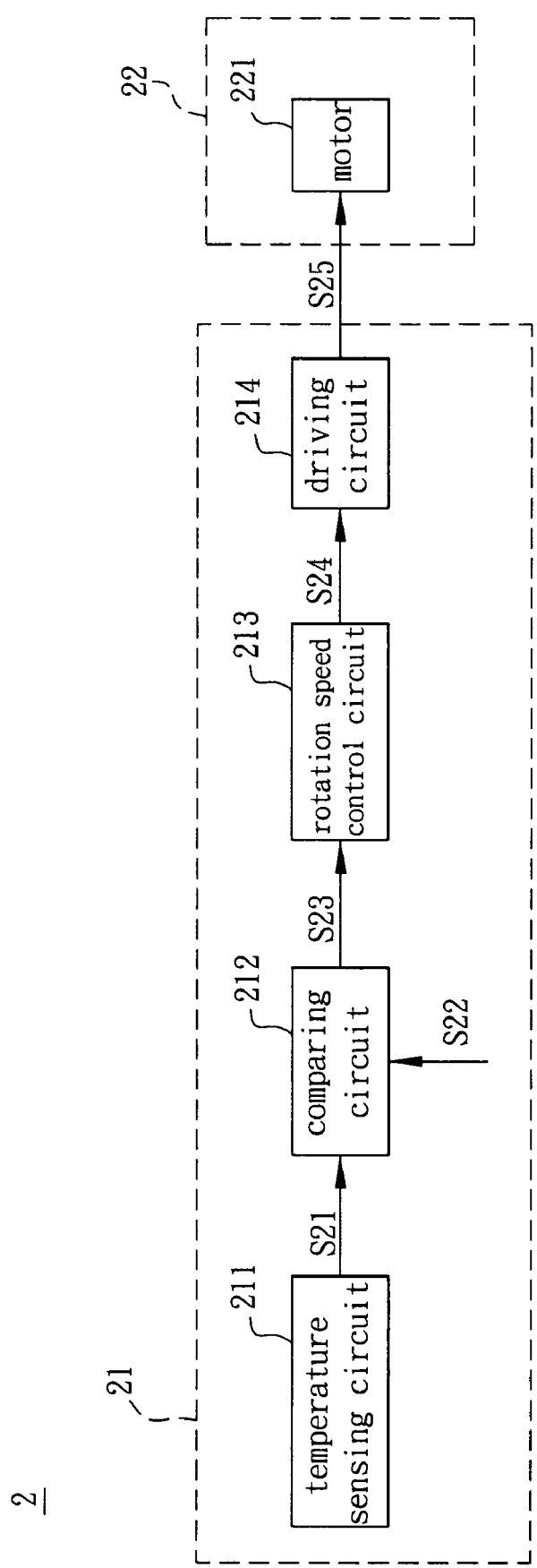
FIG. 2 is a schematic block diagram showing a fan system according to an embodiment of the invention.

FIG. 2 is a block diagram showing a fan system 2 according to an embodiment of the invention. Referring to FIG. 2, the fan system 2 includes a driving control device 21 and a fan 22. The driving control device 21 has a temperature sensing circuit 211, a comparing circuit 212, a rotation speed control circuit 213 and a driving circuit 214. The fan 22 has a motor 221, which is electrically connected to the driving control device 21.

The temperature sensing circuit 211 senses an environment temperature variation to generate a sensing signal S21. The comparing circuit 212 receives the sensing signal S21 and compares the sensing signal S21 with a reference voltage signal S22 to output a comparing signal S23.

The rotation speed control circuit 213 has a first threshold value $V_U$ and a second threshold value $V_L$. The rotation speed control circuit 213 generates a rotation speed control signal S24 after receiving the comparing signal S23 and comparing the comparing signal S23 with the first threshold value $V_U$ and the second threshold value $V_L$.

The driving circuit 214 receives the rotation speed control signal S24 outputted by the rotation speed control circuit 213 to generate a driving signal S25 for controlling the motor 221 of the fan 22.

Figure 3A:
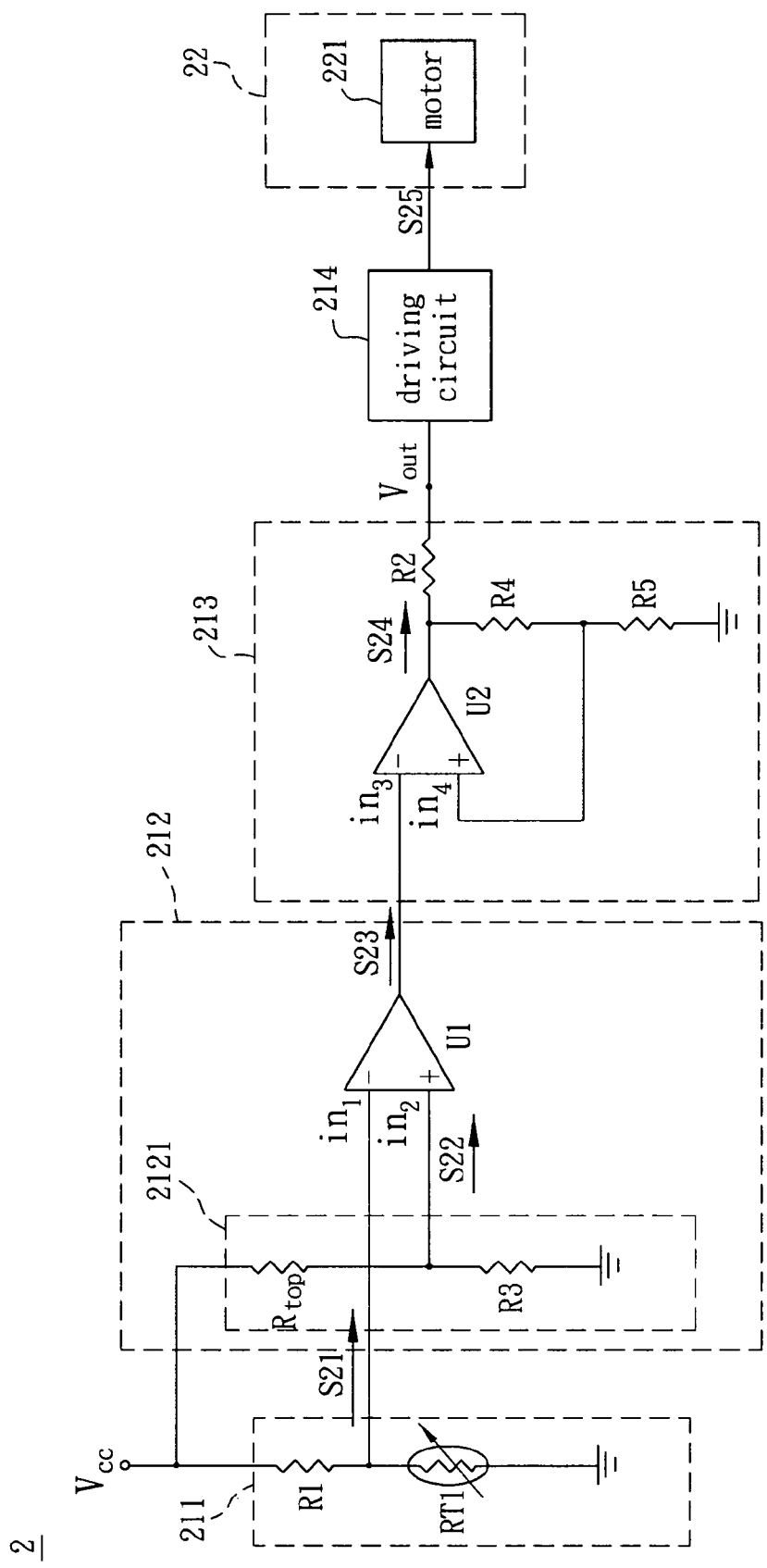
FIG. 3A is a schematic circuit diagram showing the fan system according to the embodiment of the invention.

Please referring to FIG. 3A, which is a circuit block diagram showing each circuit of the fan system 2.

The temperature sensing circuit 211 has a first resistor R1 and a sensing element RT1. The sensing element RT1 is electrically connected to the first resistor and a ground. The first resistor R1 and the sensing element RT1 divide an operating voltage $V_{CC}$ to generate the sensing signal S21. The sensing element RT1 generates different sensing signal S21 in accordance with the variation of the environmental temperature. In the embodiment, the sensing element RT1 is a thermal resistor, and the sensing signal S21 is a voltage signal divided by the first resistor R1 and the sensing element RT1.

In addition, the sensing element RT1 can be a positive temperature coefficient (PTC) thermistor, a negative temperature coefficient (NTC) thermistor or a thermocoupler. Each of the PTC thermistor, NTC thermistor and thermocoupler can generate the sensing signal S21 in accordance with the variation of the environmental temperature.

The comparing circuit 212 includes a comparator U1, which has a first input terminal in1, a second input terminal $in_2$ and a first output terminal. The first input terminal in1 receives the sensing signal S21, the second input terminal $in_2$ receives a reference voltage signal S22, and the output terminal outputs the comparing signal S23 after comparing the sensing signal S21 with the reference voltage signal S22. In the embodiment, the comparator U1 is an operational amplifier or any element or circuit with the comparing function. In addition, each of the reference voltage S22 and the comparing signal S23 is a voltage signal. Moreover, when the reference signal S22 is greater than the sensing signal S21, the comparing signal S23 will be a high level signal (high voltage signal); otherwise, when the reference signal S22 is smaller than the sensing signal S21, the comparing signal S23 will be a low level signal (low voltage signal).

Furthermore, the comparing circuit 212 further includes a voltage divided circuit 2121, which includes a top resistor $R_{top}$ and a third resistor R3. One end of the top resistor $R_{top}$ is electrically connected to the operating voltage $V_{CC}$, and the other end of the top resistor $R_{top}$ is electrically connected to one end of the third resistor R3 and the second input terminal $in_2$. The other end of the third resistor R3 is electrically connected to the ground. The voltage divided circuit 2121 divides the operating voltage $V_{CC}$ so as to generate the reference voltage signal S22, which is inputted into the second input terminal $in_2$ of the comparator U1.

The rotation speed control circuit 213 generates the rotation speed control signal S24 after receiving the comparing signal S23 and comparing the comparing signal S23 with the first threshold value $V_U$ and the second threshold value $V_L$. The rotation speed control circuit 213 can be a Schmitt Trigger circuit, a comparator with a delay function or any circuit or element with a delay function. In the embodiment, the rotation speed control circuit 213 is a Schmitt Trigger circuit and the rotation speed control signal S24 is a voltage signal. The Schmitt Trigger circuit has an operational amplifier U2, a fourth resistor R4 and a fifth resistor R5. The operational amplifier U2 has a third input terminal $in_3$, a fourth terminal $in_4$ and a second output terminal. The third input terminal $in_3$ receives the comparing signal S23, and the fourth terminal in4 is electrically connected to one end of the fourth resistor R4 and one end of the fifth resistor R5. The second output terminal is electrically connected to the other end of the fourth resistor R4 and outputs the rotation speed control signal S24. The other end of the fifth resistor R5 is electrically connected to the ground.

Figure 3B:
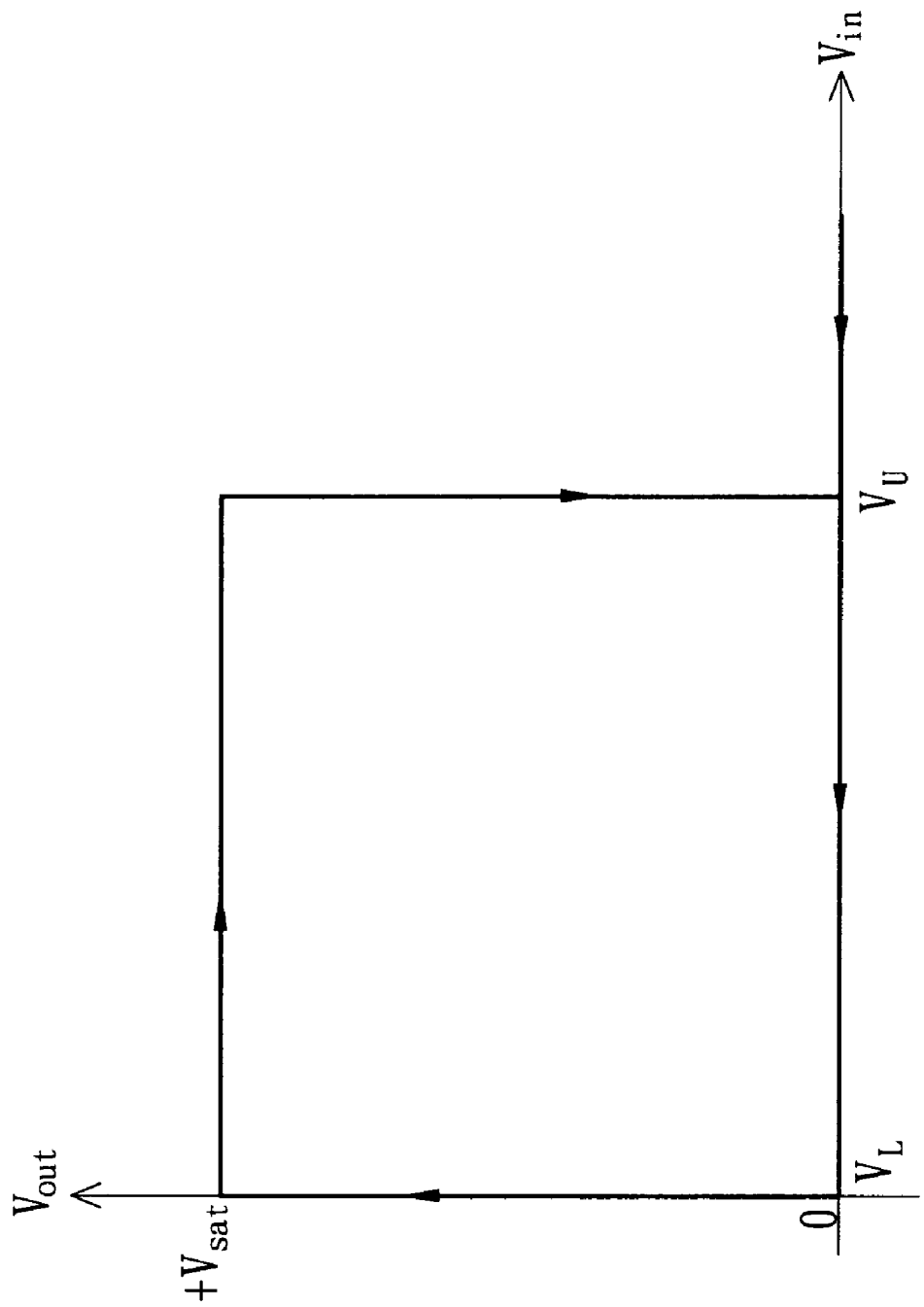
FIG. 3B is a schematic diagram showing a variation status of the comparing signal and the rotation speed control signal in the rotation speed control circuit according to the embodiment of the invention.

Referring to FIG. 3B, in the Schmitt Trigger circuit, when the comparing signal S23 (the voltage signal $V_{in}$) is gradually raised from a lower voltage value to a higher voltage value, which is still smaller than the first threshold value $V_U$, the second output terminal of the operational amplifier U2 outputs the rotation speed control signal S24 with a positive saturation voltage signal $+V_{sat}$. Alternatively, when the comparing signal S23 (the voltage signal $V_{in}$) reaches a higher voltage value that is greater than the first threshold value $V_U$, the second output terminal of the operational amplifier U2 outputs the rotation speed control signal S24 with a zero voltage signal 0V. Similarly, when the comparing signal S23 (the voltage signal $V_{in}$) is gradually decreased from higher voltage value to a lower voltage value, which is still greater than the second threshold value $V_L$, the second output terminal of the operational amplifier U2 outputs the rotation speed control signal S24 with the zero voltage signal 0V. Alternatively, when the comparing signal S23 (the voltage signal $V_{in}$) reaches a lower voltage value that is smaller than the second threshold value $V_L$, the second output terminal of the operational amplifier U2 outputs the rotation speed control signal S24 with the positive saturation voltage signal $+V_{sat}$. The Schmitt Trigger circuit is a circuit, which can eliminate the interference of noise of the input voltage and transfer the input voltage according to two threshold voltages $V_U$ and $V_L$ to form the square wave so as to output the two stage rotation speed control signal S24. The Schmitt Trigger circuit also outputs a quadratic square wave transferred from an unstable inputting voltage signal.

Referring to FIG. 3A, the rotation speed control circuit 213 further has a second resistor R2, which is electrically connected to the second output terminal of the operational amplifier U2 of the Schmitt Trigger circuit for adjusting the voltage values of the first threshold value $V_U$ and the second threshold value $V_L$ and outputting the rotation speed control signal S24.

The driving control circuit 214 includes a driving chip (not shown), which receives the rotation speed control signal S24 outputted by the rotation speed control circuit 213 for generating the driving signal S25 and controlling the rotation speed of the motor 221 of the fan 22 in accordance with the driving signal S25. In the embodiment, the driving signal S25 is a voltage signal.

The driving chip of the driving circuit 214 can be a microprocessor or any circuit or element with the same function.

In addition, the driving circuit 214 further includes a hall element (not shown), which is electrically connected to the driving chip so as to receive the voltage signal of the driving signal S25. The hall element then transfers the voltage signal into a current signal for driving the motor 221 of the fan 22.

Moreover, each of the sensing signal S21, the reference voltage signal S22, the comparing signal S23, the rotation speed control signal S24 and the driving signal S25 can be a transmitted signal, like a voltage signal or a current signal.

Furthermore, the first resistor, the top resistor, the third resistor, the fourth resistor, the fifth resistor and the second resistor with reference to the drawings are described as the equivalent resistances. Actually, each of the resistors can be implemented by one or more resistors.

In the embodiment, the driving control device of the motor is the above-mentioned driving control device 21. The function, structure and configuration of the driving control device are described hereinabove, so the detailed descriptions are omitted.

In summary, the fan system and the driving control device of the motor utilizes the comparing circuit and the rotation speed control circuit to achieve the two stages of the rotation speed control of the fan. Therefore, the chip with the complex operation function in the driving circuit of the related art is unnecessary so that the manufacturing cost of the driving control device can be decreased.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

The invention claimed is:

1. A driving control device of a motor comprising:
   a temperature sensing circuit sensing an environmental temperature for generating a sensing signal;
   a comparing circuit electrically connected to the temperature sensing circuit and comparing the sensing signal with a reference voltage signal for outputting a comparing signal;
   a rotation speed control circuit electrically connected to the comparing circuit and having a first threshold value and a second threshold value, both of which are compared with the comparing signal for generating a rotation speed control signal; and
   a driving circuit electrically connected to the rotation speed control circuit and generating a driving signal for driving a motor in accordance with the rotation speed control signal.

2. The driving control device according to claim 1, wherein the sensing signal, the reference voltage signal, the comparing signal and the rotation speed control signal are voltage signals respectively.

3. The driving control device according to claim 1, wherein in the comparing circuit, the comparing signal is a high level signal if the reference voltage signal is higher than the sensing signal, or the comparing signal is a low level signal if the reference voltage signal is lower than the sensing signal.

4. The driving control device according to claim 1, wherein the temperature sensing circuit comprises a sensing element for detecting the environmental temperature to generate the sensing signal, and a first resistor electrically connected to the sensing element.

5. The driving control device according to claim 4, wherein the sensing element is a thermistor, a positive temperature coefficient (PTC) thermistor, a negative temperature coefficient (NTC) thermistor or a thermocoupler.

6. The driving control device according to claim 1, wherein the comparing circuit comprises a comparator and a voltage dividing circuit, the comparator receives and compares the sensing signal with the reference voltage signal so as to output the comparing signal, the voltage dividing circuit is electrically connected to the operating voltage, an input of the comparator and a ground, and the voltage dividing circuit generates the reference voltage signal and transmits the reference voltage signal to the comparator.

7. The driving control device according to claim 1, wherein the rotation speed control circuit comprises a Schmitt Trigger circuit, a comparator with a delay function or other circuit with a delay function for receiving the comparing signal outputted from the comparing circuit and outputting the rotation speed control signal to the driving circuit.

8. The driving control device according to claim 7, wherein the rotation speed control circuit further comprises a second resistor electrically connected to the Schmitt Trigger circuit.

9. The driving control device according to claim 7, wherein the Schmitt Trigger circuit has an operational amplifier and two resistors, and outputs a quadratic square wave transferred from an unstable inputting-voltage signal.

10. The driving control device according to claim 1, wherein the driving circuit comprises a driving chip or a microprocessor for receiving the rotation speed control signal and outputting the driving signal, and the rotation speed control signal and the driving signal are voltage signals.

11. The driving control device according to claim 10, wherein the driving circuit further comprises a Hall sensing element electrically connected to the driving chip, receiving the driving signal, and transforming the driving signal into a current signal for driving the fan.

12. A fan system comprising:
   a driving control device comprising:
      a temperature sensing circuit sensing an environmental temperature for generating a sensing signal, a comparing circuit electrically connected to the temperature sensing circuit and comparing the sensing signal with a reference voltage signal for outputting a comparing signal, a rotation speed control circuit electrically connected to the comparing circuit and having a first threshold value and a second threshold value, both of which are compared with the comparing signal for generating a rotation speed control signal, and a driving circuit electrically connected to the rotation speed control circuit and generating a driving signal for driving a motor in accordance with the rotation speed control signal; and a fan electrically connected to the driving control device for receiving the driving signal.

13. The fan system according to claim 12, wherein the sensing signal, the reference voltage signal, the comparing signal and the rotation speed control signal are voltage signals, respectively.

14. The fan system according to claim 12, wherein in the comparing circuit, the comparing signal is a high level signal if the reference voltage signal is higher than the sensing signal, or the comparing signal is a low level signal if the reference voltage signal is lower than the sensing signal.

15. The fan system according to claim 12, wherein the temperature sensing circuit comprises a sensing element for detecting the environmental temperature to generate the sensing signal, and a first resistor electrically connected to the sensing element.

16. The fan system according to claim 15, wherein the sensing element is a thermistor, a positive temperature coefficient (PTC) thermistor, a negative temperature coefficient (NTC) thermistor or a thermocoupler.

17. The fan system according to claim 12, wherein the comparing circuit comprises a comparator and a voltage dividing circuit, the comparator receiving and comparing the sensing signal with the reference voltage signal so as to output the comparing signal, the voltage dividing circuit electrically connected to the operating voltage, an input of the comparator and a ground, and the voltage dividing circuit generating the reference voltage signal and transmitting the reference voltage signal to the comparator.

18. The fan system according to claim 12, wherein the rotation speed control circuit comprises a Schmitt Trigger circuit, a comparator with a delay function and a circuit with a delay function for receiving the comparing signal outputted from the comparing circuit and outputting the rotation speed control signal to the driving circuit.

19. The fan system according to claim 18, wherein the rotation speed control circuit further comprises a second resistor electrically connected to the Schmitt Trigger circuit.

20. The fan system according to claim 12, wherein the driving circuit comprises a driving chip or a microprocessor for receiving the rotation speed control signal, and the rotation speed control signal and the driving signal are voltage signals.

21. The fan system according to claim 20, wherein the driving circuit further comprises a Hall sensing element electrically connected to the driving chip, receiving the driving signal for transforming the driving signal into a current signal for driving the fan.

* * * * *